US012671231B2

(12) United States Patent
Lee et al.

(10) Patent No.: US 12,671,231 B2
(45) Date of Patent: Jun. 30, 2026

(54) OPTO-ELECTRONIC SYSTEM AND METHOD

(71) Applicant: EFFECT Photonics B.V., Eindhoven (NL)

(72) Inventors: Sian Chong Jeffrey Lee, Kempen (DE); Aaron Albores-Mejia, Eindhoven (NL); Emil Kleijn, Son en Breugel (NL); Erwin Mathijn Van Vliet, Eindhoven (NL)

(73) Assignee: EFFECT PHOTONICS B.V., Eindhoven (NL)

( * ) Notice: Subject to any disclaimer, the term of this patent is extended or adjusted under 35 U.S.C. 154(b) by 761 days.

(21) Appl. No.: 18/083,892

(22) Filed: Dec. 19, 2022

(65) Prior Publication Data
US 2023/0198227 A1 Jun. 22, 2023

(30) Foreign Application Priority Data
Dec. 22, 2021 (EP) ..................................... 21217165

(51) Int. Cl.
H01S 5/0687 (2006.01)
H01S 5/026 (2006.01)
H01S 5/068 (2006.01)

(52) U.S. Cl.
CPC .......... *H01S 5/0687* (2013.01); *H01S 5/0264* (2013.01); *H01S 5/06817* (2013.01); *H01S 5/026* (2013.01)

(58) Field of Classification Search
CPC ...... H01S 5/0687; H01S 5/026; H01S 5/0264; H01S 5/06817
See application file for complete search history.

(56) References Cited

U.S. PATENT DOCUMENTS 6,445,477 B1 * 9/2002 Madsen ................ G01J 9/0246
385/9
2003/0095736 A1 5/2003 Kish, Jr. et al.
(Continued)

FOREIGN PATENT DOCUMENTS

CN 110058351 A 7/2019
JP 2000236135 A 8/2000
(Continued)

OTHER PUBLICATIONS

Taiwanese Office Action dated Jan. 17, 2024 for family member Application No. 111148036.
(Continued)

*Primary Examiner* — James A Menefee
(74) *Attorney, Agent, or Firm* — Hudak, Shunk & Farine Co. LPA

(57) ABSTRACT

An opto-electronic system including a PIC that includes a semiconductor-based tunable laser source that can achieve single-mode lasing thereby emitting optical radiation having a predefined linewidth at a predefined operating wavelength. The PIC also includes an optical measurement unit that can receive the optical radiation emitted by said laser source, and provide a signal representative for the received optical radiation to a control unit of the opto-electronic system that is operatively connected with said laser source and the optical measurement unit. The opto-electronic system enables omitting external optical measurement equipment thereby enabling a faster and cheaper way of locking of the predefined operating wavelength of said laser and achieving the predefined linewidth. A method of improved tuning of a semiconductor-based tunable laser source of an opto-electronic system.

15 Claims, 3 Drawing Sheets

(56)     References Cited

U.S. PATENT DOCUMENTS

| | | | |
|---|---|---|---|
| 2003/0128922 | A1 | 7/2003 | Kolodziejski et al. |
| 2012/0063474 | A1 | 3/2012 | Ayotte et al. |
| 2017/0201070 | A1 | 7/2017 | Evans et al. |
| 2017/0353001 | A1* | 12/2017 | Takabayashi ......... H01S 5/1007 |
| 2018/0010967 | A1 | 1/2018 | Seeley et al. |
| 2018/0183517 | A1* | 6/2018 | Sugiyama .......... G02B 6/12009 |
| 2019/0221995 | A1* | 7/2019 | Heaton ................... H01S 5/124 |
| 2021/0227304 | A1 | 7/2021 | Mazed |
| 2021/0242662 | A1 | 8/2021 | Heim et al. |

FOREIGN PATENT DOCUMENTS

| | | | |
|---|---|---|---|
| JP | 2011155320 | A | 8/2011 |
| WO | 0052789 | A2 | 9/2000 |
| WO | 03043247 | A2 | 5/2003 |
| WO | 2009105633 | A2 | 8/2009 |

OTHER PUBLICATIONS

Japanese Office Action dated Dec. 26, 2023 for family member Application No. 2022-200780.

Chinese Search Report dated Dec. 13, 2025 for corresponding patent family CN202211652524X.

\* cited by examiner

Fig. 3

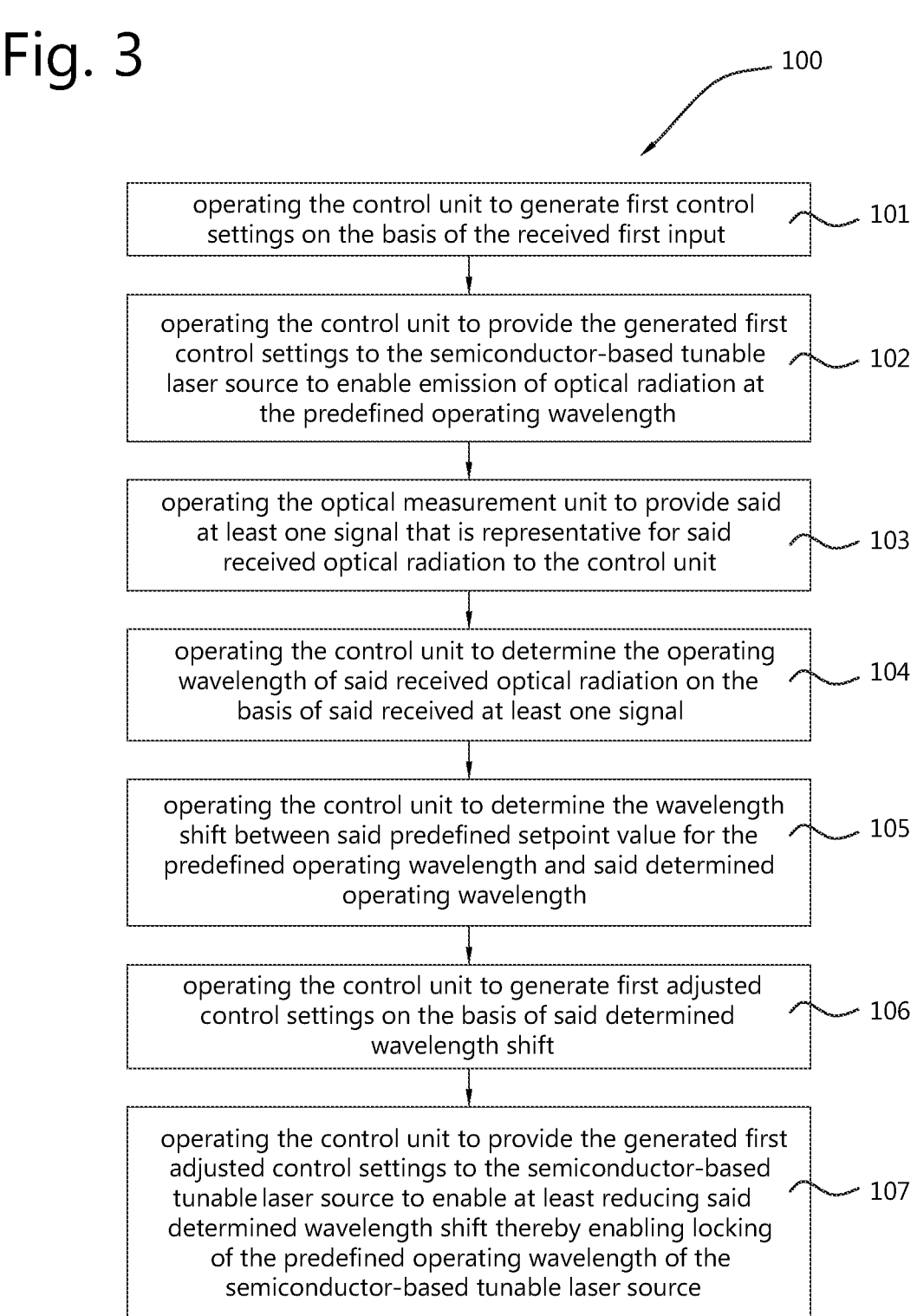

100 operating the control unit to generate first control settings on the basis of the received first input — 101 operating the control unit to provide the generated first control settings to the semiconductor-based tunable laser source to enable emission of optical radiation at the predefined operating wavelength — 102 operating the optical measurement unit to provide said at least one signal that is representative for said received optical radiation to the control unit — 103 operating the control unit to determine the operating wavelength of said received optical radiation on the basis of said received at least one signal — 104 operating the control unit to determine the wavelength shift between said predefined setpoint value for the predefined operating wavelength and said determined operating wavelength — 105 operating the control unit to generate first adjusted control settings on the basis of said determined wavelength shift — 106 operating the control unit to provide the generated first adjusted control settings to the semiconductor-based tunable laser source to enable at least reducing said determined wavelength shift thereby enabling locking of the predefined operating wavelength of the semiconductor-based tunable laser source — 107

OPTO-ELECTRONIC SYSTEM AND METHOD

FIELD OF THE INVENTION

The present invention relates to an opto-electronic system that can be used for example, but not exclusively, for optical telecommunication applications, Light Detection and Ranging (LIDAR) or sensor applications. The invention further relates to a method of improved tuning of a semiconductor-based tunable laser source of an opto-electronic system according to the invention.

BACKGROUND OF THE INVENTION

Opto-electronic systems can be applied for example, but not exclusively, in the field of optical telecommunication applications, LIDAR or sensor applications. An opto-electronic system that for example can be used in optical telecommunication applications, can comprise a photonic integrated circuit (PIC) that can have a semiconductor-based tunable laser source that is configurable to emit radiation at operating wavelengths suitable for optical telecommunication. The operating wavelength of radiation emitted by a semiconductor-based tunable laser source can change unintentionally, for example due to temperature changes and/or aging. This limits application of both the semiconductor-based tunable laser source and the PIC comprising such a laser source in optical telecommunication applications in which wavelength multiplexing is used to increase data rates.

A semiconductor-based tunable laser source typically has a number of controls that need to be set to achieve single-mode lasing at a desired operating wavelength. As effects of the controls on the radiation emitted by a semiconductor-based tunable laser source are different for each individual laser source, mapping of the effects and calibration of the laser source is required. Conventionally, calibration is performed after dicing and mounting of the semiconductor-based tunable laser source and requires external equipment, and long processing times. Known solution for controlling the operating wavelength of radiation emitted by a semiconductor-based laser source rely on splitting the emitted radiation and providing a part of the emitted radiation to an external wavelength locker (WLL). A disadvantage of such known solutions is that the external WLL adds bulk and costs to the opto-electronic system. Another disadvantage is that using the external WLL requires cumbersome optical alignment of the external WLL and the PIC of the opto-electronic system. The latter renders tuning of the semiconductor-based tunable laser source of the PIC slow.

The person skilled in the art will appreciate that an ever increasing demand for higher data rates, typically in optical telecommunication applications, requires faster and more precise control of in particular the semiconductor-based tunable laser source of the PIC of the opto-electronic system. Therefore, there is a need to provide an opto-electronic system that enables improved tuning of the integrated semiconductor-based tunable laser source.

SUMMARY OF THE INVENTION

It is an object of the present invention to provide an opto-electronic system that can be used for example, but not exclusively, for optical telecommunication applications, LIDAR or sensor applications, pre-empting or at least reducing at least one of the above-mentioned and/or other disadvantages associated with opto-electronic systems known in the art that can be used in the above-mentioned application domains.

It is also an object of the present invention to provide a method of improved tuning of a semiconductor-based tunable laser source of an opto-electronic system according to the invention.

Aspects of the present invention are set out in the accompanying independent and dependent claims. Features from the dependent claims may be combined with features from the independent claim as appropriate and not merely as explicitly set out in the claims. Furthermore, all features may be replaced with other technically equivalent features.

At least one of the abovementioned objects is achieved by an opto-electronic system that is configured and arranged to enable improved tuning of an integrated semiconductor-based tunable laser source. The opto-electronic system comprises a PIC that comprises a semiconductor-based tunable laser source that is configurable to achieve single-mode lasing thereby emitting optical radiation having a predefined linewidth at a predefined operating wavelength, and an optical measurement unit that is configured and arranged to receive the optical radiation emitted by the semiconductor-based tunable laser source, and provide at least one signal that is representative for the received optical radiation. The opto-electronic system further comprises a control unit that is operatively connected with the semiconductor-based tunable laser source and the optical measurement unit of the PIC, the control unit being configured to receive first input including a setpoint value for the predefined operating wavelength of the semiconductor-based tunable laser source at which the optical radiation is to be emitted, generate first control settings on the basis of the received first input, provide the generated first control settings to the semiconductor-based tunable laser source to enable emission of optical radiation at the predefined operating wavelength, receive said at least one signal that is representative for said received optical radiation, determine the operating wavelength of said received optical radiation on the basis of said received at least one signal, determine a wavelength shift between said predefined setpoint value for the predefined operating wavelength and said determined operating wavelength, generate first adjusted control settings on the basis of said determined wavelength shift, and provide the generated first adjusted control settings to the semiconductor-based tunable laser source to enable at least reducing said determined wavelength shift thereby enabling locking of the predefined operating wavelength of the semiconductor-based tunable laser source.

The above-defined embodiment of the opto-electronic system provides a faster solution for locking of the predefined operating wavelength of an integrated semiconductor-based tunable laser source than solutions known in the art that use external optical measurement equipment for achieving the above-described wavelength locking of the predefined operating wavelength of an integrated semiconductor-based tunable laser source. The solutions known in the art require accurate optical alignment of the external optical measurement equipment and the integrated semiconductor-based tunable laser source involving optical fiber-to-PIC alignment techniques. Therefore, the known solutions are quite cumbersome and consequently slower than the solution offered by the opto-electronic system according to the present invention that can obviate these disadvantages as the above-mentioned cumbersome optical fiber-to-PIC alignment techniques are no longer required. At least because of the faster wavelength locking process offered by the above-defined embodiment of the opto-electronic system according to the invention, at least one of initialization, calibration and mode mapping of the semiconductor-based tunable laser source of the PIC can be performed faster and consequently at lower costs than the costs that would be incurred by solutions known in the art that use external optical measurement equipment. Moreover, the opto-electronic system according to the present invention enables on-wafer mode mapping of the integrated semiconductor-based tunable laser source of the PIC.

It is noted that irrespective of the way in which the linewidth of the emitted optical radiation is measured and/or under which conditions, such as for example period of time, temperature and/or humidity, the predefined linewidth in the context of the present invention is to be construed as the linewidth that can be controlled to have a desired and therefore a predefined value at a predefined operating wavelength of the integrated semiconductor-based tunable laser source.

The person skilled in the art will appreciate that the at least one signal provided by the optical measurement unit to the control unit can be an electrical signal or an optical signal. In addition, the control unit can be an electronic control unit or an opto-electronic control unit, and the first control settings and the first adjusted control settings can be generated by the control unit using a single control algorithm or using multiple control algorithms. Furthermore, it is noted that the wavelength shift that is determined between said predefined setpoint value for the predefined operating wavelength and said determined operating wavelength is to be construed as a difference between two values.

The opto-electronic system according to the present invention can be used for example, but not exclusively, for telecommunication applications, LIDAR or sensor applications. In that case, the opto-electronic system can be one of a transmitter, a receiver, a transceiver, a coherent transmitter, a coherent receiver and a coherent transceiver.

In an embodiment of the opto-electronic system according to the invention, the optical measurement unit of the PIC is configured to provide at least three electrical signals, each of the at least three electrical signals having a time-varying intensity and being representative for the optical radiation received from the semiconductor-based tunable laser source, and wherein the control unit is configured to determine the wavelength shift between the setpoint value for the predefined operating wavelength and the determined operating wavelength on the basis of phase information about the at least three electrical signals which is derivable from the time-varying intensities of the at least three electrical signals.

In accordance with the above-defined embodiment of the opto-electronic system, the optical measurement unit enables a way of determining the wavelength shift between the setpoint value for the predefined operating wavelength and the determined operating wavelength that is advantageous for adjusting the semiconductor-based tunable laser source for maintaining a constant operating wavelength. It is noted that if the wavelength shift between the setpoint value for the predefined operating wavelength and the determined operating wavelength becomes too large, a phase shift of a respective electrical signal, the phase shift being related to the intensity of the respective electrical signal, can suddenly switch from −π to +π. This so-called phase wrapping needs to be taken into account to avoid instabilities in the wavelength locking process. The control unit can be configured to unwrap a respective electrical signal for achieving a smooth mode map for the semiconductor-based tunable laser source.

An advantage of the wavelength locking optical measurement unit of the opto-electronic system according to the present invention is that the Free Spectral Range (FSR) or period can be freely chosen. Conventional etalon-based two-phase wavelength locking optical measurement units have a response that is only sensitive on the cross-points and therefore pre-determined and periodic on typically a 50 GHz (0.4 nm) channel spacing. It is therefore difficult to track a semiconductor-based tunable laser source that drifts across several channels, because between channels there is a point at which it cannot be determined in which direction the semiconductor-based tunable laser source moves.

The optical measurement unit of the opto-electronic system according to the present invention can be construed as an integrated three-phase wavelength locker that has the same sensitivity across the entire frequency band. As long as it can be determined in which period the semiconductor-based tunable laser source starts, it can be tracked along several periods. In addition, it is possible to combine dual-stage wavelength lockers, wherein a first stage having a broad FSR can provide a rough estimate of the operating wavelength and a second stage having a narrow FSR can provide a precise value for the operating wavelength.

The person skilled in the art will appreciate that it is also possible to design a very narrow FSR in order to enable measuring small wavelength deviations. This is especially useful for measuring frequency noise that provides an indication of the stability of the semiconductor-based tunable laser source in a particular tuning setting.

Moreover, it is possible to use the wavelength locking optical measurement unit of the opto-electronic system in accordance with the present invention to determine fast switching effects of the semiconductor-based tunable laser source. Typically, if a semiconductor-based tunable laser source needs to be switched from one wavelength to another, the electrical tuning currents need to be changed to a different setpoint. This change in electrical currents causes a change of thermal equilibrium that in itself causes a small wavelength drift. Hence, it takes some time for the semiconductor-based tunable laser source to settle on the target wavelength. As a result, the potential nanosecond switching time that the semiconductor-based tunable laser source intrinsically has is limited to a millisecond switching time. The wavelength locking optical measurement unit of the opto-electronic system according to the present invention can be used to determine the time constants of the above-mentioned effects that are different for each assembled semiconductor-based tunable laser source due to variations in the production process. The control unit of the opto-electronic system according to the present invention can use the determined time constants to compensate for these above-mentioned effects. The integrated optical measurement unit of the opto-electronic system according to the present invention allows to map time constants for all possible switching events without the need for expensive external optical measurement equipment.

In an embodiment of the opto-electronic system according to the invention, the semiconductor-based tunable laser source of the PIC comprises a back mirror that is configured to have a partial reflectivity that allows emission of a predefined amount of optical power of the optical radiation via the back mirror.

The person skilled in the art will appreciate that a semiconductor-based tunable laser source typically comprises a front mirror that is configured to have a partial reflectivity that allows emission of optical radiation whereas the back mirror is configured to have a reflectivity that ideally prevents emission of optical radiation via the back mirror. However, due to processing tolerances, it is possible that the back mirror in practice has a partial reflectivity that allows leakage of optical radiation to occur via the back mirror. It will be clear that the reflectivity of a mirror that is intended to be used as the back mirror is always higher than the reflectivity of a mirror that is intended to be used as the front mirror.

In the context of the present invention, the predefined amount of optical power of the optical radiation that is emitted via the back mirror should be sufficient to allow the optical measurement unit to provide at least one signal that is representative for the received optical radiation to the control unit for generating the above-mentioned first adjusted control settings to the semiconductor-based tunable laser source. The predefined amount of optical power that is emitted via the back mirror is sufficient if it is in a range of 1 µW (−30 dBm) to 10 mW (10 dBm).

In an embodiment of the opto-electronic system according to the invention, the optical measurement unit of the PIC comprises a first optical splitter-combiner unit having a first end part that is provided with at least a first optical interface, and a second end part that is provided with at least a second optical interface and a third optical interface, a second optical splitter-combiner unit having a third end part that is provided with at least a fourth optical interface and a fifth optical interface, and a fourth end part that is provided with at least a sixth optical interface, a seventh optical interface, and an eighth optical interface, a set of at least three photodetectors, each of the at least three photodetectors being configured to detect at least a part of the received optical radiation that is emitted via the back mirror of the semiconductor-based tunable laser source, a plurality of optical waveguides, wherein a first optical waveguide of the plurality of optical waveguides is arranged to optically interconnect the first optical interface of the first end part of the first optical splitter-combiner unit and the back mirror of the semiconductor-based tunable laser source, a second optical waveguide of the plurality of optical waveguides has a first optical pathlength, L1, the second optical waveguide being arranged to optically interconnect the second optical interface of the second end part of the first optical splitter-combiner unit and the fourth optical interface of the third end part of the second optical splitter-combiner unit, a third optical waveguide of the plurality of optical waveguides has a second optical pathlength, L2, that is different from the first optical pathlength, L1, of the second optical waveguide, the third optical waveguide being arranged to optically interconnect the third optical interface of the second end part of the first optical splitter-combiner unit and the fifth optical interface of the third end part of the second optical splitter-combiner unit, a fourth optical waveguide of the plurality of optical waveguides is arranged to optically interconnect the sixth optical interface of the fourth end part of the second optical splitter-combiner unit and a first photodetector of said set of photodetectors, a fifth optical waveguide of the plurality of optical waveguides is arranged to optically interconnect the seventh optical interface of the fourth end part of the second optical splitter-combiner unit and a second photodetector of said set of photodetectors, a sixth optical waveguide of the plurality of optical waveguides is arranged to optically interconnect the eighth optical interface of the fourth end part of the second optical splitter-combiner unit and a third photodetector of said set of photodetectors, and wherein the opto-electronic system comprises a first set of at least three electrical connection elements, each of the at least three electrical connection elements being arranged to electrically interconnect a respective photodetector of said set of photodetectors of the optical measurement unit of the PIC and the control unit, and a second set of electrical connection elements, each electrical connection element of said second set of electrical connection elements being arranged to electrically interconnect the control unit and the semiconductor-based tunable laser source of the PIC.

In accordance with the above-defined embodiment of the opto-electronic system, the optical measurement unit in cooperation with the control unit can be used for faster and more accurately locking of the predefined operating wavelength of the semiconductor-based tunable laser source. Optical radiation emitted via the back mirror of the semiconductor-based tunable laser source is guided by the first optical waveguide to the first optical splitter-combiner unit. The first optical splitter-combiner unit is configured to split the received optical radiation in a first part and a second part. The first part of the received optical radiation is guided by the second optical waveguide of the plurality of optical waveguides to the fourth optical interface of the third end part of the second optical splitter-combiner unit. The second part of the received optical radiation is guided by the third optical waveguide of the plurality of optical waveguides to the fifth optical interface of the third end part of the second optical splitter-combiner unit. As the first optical pathlength, L1, of the second optical waveguide is different from the second optical pathlength, L2, of the third optical waveguide, the first part of the received optical radiation has a first phase, f1, at the fourth optical interface of the third end part of the second optical splitter-combiner unit and the second part of the received optical radiation has a second phase, f2, at the fifth optical interface of the third end part of the second optical splitter-combiner unit, wherein the first phase, f1, and the second phase, f2, are different from each other.

The second optical splitter-combiner unit is configured to provide three optical signals having time-varying intensities, the three optical signals are based on the first part and the second part of the received optical radiation. A first optical signal of the three optical signals is guided by the fourth optical waveguide of the plurality of optical waveguides from the sixth optical interface of the fourth end part of the second optical splitter-combiner unit to a first photodetector of said set of photodetectors. A second optical signal of the three optical signals is guided by the fifth optical waveguide of the plurality of optical waveguides from the seventh optical interface of the fourth end part of the second optical splitter-combiner unit to a second photodetector of said set of photodetectors, and a third optical signal of the three optical signals is guided by the sixth optical waveguide of the plurality of optical waveguides from the eighth optical interface of the fourth end part of the second optical splitter-combiner unit to a third photodetector of said set of photodetectors.

Each of said three photodetectors is configured to provide an electrical signal that is representative for the received respective optical signal of the three optical signals. Each of the three electrical signals is provided to the control unit via the first set of at least three electrical connection elements. The control unit is configured to determine the wavelength shift between the setpoint value for the predefined operating wavelength and the determined operating wavelength on the basis of the time-varying intensities of the received three electrical signals, and to generate first adjusted control settings on the basis of the determined wavelength shift. As mentioned above, the determined wavelength shift is to be construed as a difference between two values.

The generated first adjusted control settings are provided to the semiconductor-based tunable laser source via the second set of electrical connection elements. The generated first adjusted control settings enable at least reducing the determined wavelength shift thereby enabling locking of the predefined operating wavelength of the semiconductor-based tunable laser source at which the optical radiation is emitted. In this way, the control unit can be used to adjust the semiconductor-based tunable laser source for maintaining a constant operating wavelength.

In an embodiment of the opto-electronic system according to the invention, the control unit is configured to receive second input including a setpoint value for relative intensity noise of the optical radiation that is to be emitted by the semiconductor-based tunable laser source, generate second control settings on the basis of the received second input, provide the generated second control settings to the semiconductor-based tunable laser source to enable emission of optical radiation having the setpoint value for the relative intensity noise, receive said at least one signal that is representative for said received optical radiation, determine the relative intensity noise of said received optical radiation on the basis of said received at least one signal, determine an offset between said setpoint value for the relative intensity noise and said determined relative intensity noise, generate second adjusted control settings on the basis of said determined offset, and provide the generated second adjusted control settings to the semiconductor-based tunable laser source to enable at least reducing said determined offset thereby enabling controlling of the predefined linewidth of the emitted optical radiation.

In accordance with the above-defined embodiment of the opto-electronic system, the control unit enables that the determined relative intensity noise can be used as a feedback signal to achieve controlling of the predefined linewidth of the optical radiation emitted by the semiconductor-based tunable laser source. The skilled person will appreciate that the linewidth of a laser is to be construed as the width of the power spectral density of the emitted electric field in terms of wavelength, frequency or wavenumber. As mentioned above, irrespective of the way in which the linewidth of the emitted optical radiation is measured and/or under which conditions, such as for example period of time, temperature and/or humidity, the predefined linewidth in the context of the present invention is to be construed as the linewidth that can be controlled to have a desired and therefore a predefined value at a predefined operating wavelength of the semiconductor-based tunable laser source.

It is noted that the determined offset between said setpoint value for the relative intensity noise and said determined relative intensity noise is to be construed as a difference between two values.

An advantage of the above-defined embodiment of the opto-electronic system is that the components of the optical measurement unit do not need to have bandwidths that are higher than the cavity mode spacing of the semiconductor-based tunable laser source to allow using the relative intensity noise as a feedback signal. Another advantage of the above-defined embodiment of the opto-electronic system is that direct measurement of the linewidth or direct measurement of the optical spectrum of the optical radiation emitted by the semiconductor-based tunable laser source can be omitted. A further advantage of the above-defined embodiment of the opto-electronic system is that it offers fast and accurate control of the linewidth of the optical radiation emitted by the semiconductor-based laser source.

In an embodiment of the opto-electronic system according to the invention, the optical measurement unit of the PIC is configured to provide at least one electrical signal that comprises a time-varying output current of a photodetector of the at least three photodetectors, and wherein the control unit is configured to sample said at least one electrical signal over time for obtaining a set of individual time-sampled components of said at least one electrical signal, convert said set of individual time-sampled components into a set of individual spectral components that provide frequency information about the at least one electrical signal, and determine the relative intensity noise of the received optical radiation on the basis of said frequency information. In accordance with the above-defined embodiment of the opto-electronic system, the control unit can be configured to generate the set of individual spectral components using a single conversion algorithm or using multiple conversion algorithms.

In an embodiment of the opto-electronic system according to the invention, the control unit is configured to involve a Fourier Transform for obtaining said set of individual spectral components. In accordance with the above-defined embodiment of the opto-electronic system, it can be advantageous that the control unit is configured to perform the Fourier Transform as a Fast Fourier Transform (FFT).

In an embodiment of the opto-electronic system according to the invention, the first optical splitter-combiner unit and/or the second optical splitter-combiner unit of the optical measurement unit of the PIC is a multimode interference-based, MMI-based, optical splitter-combiner unit. The person skilled in the art will appreciate that the MMI-based first optical splitter-combiner unit and the MMI-based second optical splitter-combiner unit can be implemented as any suitable n×m MMI, wherein n and m are natural numbers representing the number of optical input ports and optical output ports, respectively. Regarding the first optical splitter-combiner unit, the person skilled in the art will appreciate that it can advantageously be implemented as a 1×2 MMI. However, other options such as a 2×2 MMI can also be envisaged. Regarding the second optical splitter-combiner unit, the person skilled in the art will appreciate that it can advantageously be implemented as a 2×3 MMI. Again, other options such as a 3×3 MMI can also be envisaged.

In an embodiment of the opto-electronic system according to the invention, the semiconductor-based tunable laser source of the PIC is an InP-based tunable laser source. Especially in the event that the opto-electronic system is used for optical telecommunication applications, it is advantageous if the InP-based tunable laser source is configured to provide optical radiation having a wavelength in a range from 1300 nm to 1600 nm.

In an embodiment of the opto-electronic system according to the invention, at least one photodetector of the set of at least three photodetectors comprises an InP-based photodiode (PD) and/or an InP-based semiconductor optical amplifier (SOA). The person skilled in the art will appreciate that the InP-based PD is electrically reverse biased in order to detect incident optical radiation, whereas the InP-based SOA does not need to be electrically reverse-biased. However, the InP-based SOA can be electrically reverse-biased, if required.

In an embodiment of the opto-electronic system according to the invention, at least one optical waveguide of the plurality of optical waveguides is an InP-based optical waveguide.

In an embodiment of the opto-electronic system according to the invention, the PIC is a hybrid PIC or a monolithic PIC.

It will be appreciated that a hybrid PIC allows the advantages of the present invention to be applied both in the domain of silicon photonics as in the domain of III-V photonics. An advantage of a hybrid PIC is that functional photonic blocks comprising group III-V semiconductor materials, e.g. InP-based semiconductor materials, can be used together with functional photonic blocks comprising group IV semiconductor materials, e.g. Si-based semiconductor materials, on a single die. Another advantage of enabling hybrid integration of the PIC according to the invention is that functional photonic blocks can be exchanged for example in the case of malfunction or breakdown thereof.

PICs that are applied for example, but not exclusively, in the field of optical telecommunication applications, LIDAR or sensor applications are becoming increasingly complex at least because of the increasing number of functional photonic blocks that are to be integrated on a single die that preferably has a footprint that is as small as possible. The person skilled in the art will appreciate that the most versatile technology platform for such PICs, especially for use in the above-mentioned application areas, uses wafers comprising InP-based semiconductor materials.

An advantage of an InP-based monolithic PIC is that both active components such as the tunable laser source and the photodetectors of the opto-electronic system according to the present invention, and passive components such as the optical waveguides of the opto-electronic system according to the present invention, can be integrated on the same InP-based semiconductor substrate of a single die. As a result, fabrication of an InP-based monolithic PIC can be less cumbersome and therefore can be less expensive than the assembly of a hybrid PIC that requires assembly steps for the hybrid interconnection of the active and passive opto-electronic devices each of which typically are fabricated on different substrates. In addition, an InP-based monolithic PIC possibly allows the PIC to have a smaller total footprint than the total footprint of a hybrid PIC.

In an embodiment of the opto-electronic system according to the invention, the opto-electronic system is a hybrid, single-die opto-electronic system or an InP-based monolithic opto-electronic system. An advantage of a hybrid, single-die opto-electronic system or an InP-based monolithic opto-electronic system is that active functional blocks, both photonic and electronic, such as the tunable laser source, the photodetectors and the control unit of the opto-electronic system according to the present invention, and passive functional components, both photonic and electronic, such as the optical waveguides and the electrical connection elements, can be integrated on a single die.

An advantage of a hybrid, single-die opto-electronic system is that functional photonic and/or electronic blocks comprising group III-V semiconductor materials, e.g. InP-based semiconductor materials, can be used together with functional photonic and/or electronic blocks comprising group IV semiconductor materials, e.g. Si-based semiconductor materials, on a single die. Another advantage of a hybrid, single-die opto-electronic system is that functional photonic and/or electronic blocks can be exchanged for example in the case of malfunction or breakdown thereof.

An advantage of an InP-based monolithic opto-electronic system is that its fabrication can be less cumbersome and therefore can be less expensive than the assembly of a hybrid, single-die opto-electronic system that requires a different kind of assembly steps for the hybrid interconnection of the active and passive photonic and/or electronic functional blocks and/or components. In addition, an InP-based monolithic opto-electronic system possibly allows the opto-electronic system to have a smaller total footprint than the total footprint of a hybrid, single-die opto-electronic system.

According to another aspect of the present invention, a method of improved tuning of an integrated semiconductor-based tunable laser source of an opto-electronic system according to the invention is provided, wherein the opto-electronic system comprises a control unit that is configured to receive first input including a setpoint value for the predefined operating wavelength of the semiconductor-based tunable laser source at which the optical radiation is to be emitted, wherein the method comprises operating the control unit to generate first control settings on the basis of the received first input, operating the control unit to provide the generated first control settings to the semiconductor-based tunable laser source to enable emission of optical radiation at the predefined operating wavelength, operating the optical measurement unit to provide said at least one signal that is representative for said received optical radiation to the control unit, operating the control unit to determine the operating wavelength of said received optical radiation on the basis of said received at least one signal, operating the control unit to determine the wavelength shift between said predefined setpoint value for the predefined operating wavelength and said determined operating wavelength, operating the control unit to generate first adjusted control settings on the basis of said determined wavelength shift, and operating the control unit to provide the generated first adjusted control settings to the semiconductor-based tunable laser source to enable at least reducing said determined wavelength shift thereby enabling locking of the predefined operating wavelength of the semiconductor-based tunable laser source.

The above-defined embodiment of the method according to the present invention provides a faster solution for locking of the predefined operating wavelength of the integrated semiconductor-based tunable laser source of the PIC of the opto-electronic system than solutions known in the art that use external optical measurement equipment for achieving the above-described wavelength locking of the predefined operating wavelength of an integrated semiconductor-based tunable laser source. Methods known in the art for achieving wavelength locking of an integrated semiconductor-based tunable laser source require accurate optical alignment of the external optical measurement equipment and the integrated semiconductor-based tunable laser source involving optical fiber-to-PIC alignment techniques. Therefore, the known methods are quite cumbersome and consequently slower than the method according to the present invention that can obviate these disadvantages as the above-mentioned cumbersome optical fiber-to-PIC alignment techniques are no longer required. At least because of the faster wavelength locking offered by the above-defined embodiment of the method according to the invention, at least one of initialization, calibration and mode mapping of the integrated semiconductor-based tunable laser source of the PIC of the opto-electronic system can be performed faster and consequently at lower costs than the costs that would be incurred by methods known in the art that use external measurement equipment. Moreover, the method according to the present invention enables on-wafer mode mapping of the integrated semiconductor-based tunable laser source of the PIC of the opto-electronic system.

In an embodiment of the method according to the invention, the control unit is configured to receive second input including a setpoint value for relative intensity noise of the optical radiation that is to be emitted by the semiconductor-based tunable laser source, wherein the method comprises operating the control unit to generate second control settings on the basis of the received second input, operating the control unit to provide the generated second control settings to the semiconductor-based tunable laser source to enable emission of optical radiation having the setpoint value for the relative intensity noise, operating the optical measurement unit to provide said at least one signal that is representative for said received optical radiation to the control unit, operating the control unit to determine the relative intensity noise of said received optical radiation on the basis of said received at least one signal, operating the control unit to determine the offset between said setpoint value for the relative intensity noise and said determined relative intensity noise, operating the control unit to generate second adjusted control settings on the basis of said determined offset, and operating the control unit to provide the generated second adjusted control settings to the semiconductor-based tunable laser source to enable at least reducing said determined offset thereby enabling controlling of the predefined linewidth of the emitted optical radiation.

In accordance with the above-defined embodiment of the method, the control unit enables that the determined relative intensity noise can be used as a feedback signal to achieve controlling of the predefined linewidth of the optical radiation emitted by the semiconductor-based tunable laser source.

BRIEF DESCRIPTION OF THE DRAWINGS

Further features and advantages of the invention will become apparent from the description of exemplary and non-limiting embodiments of an opto-electronic system according to the present invention and a method of improved tuning of an integrated semiconductor-based tunable laser source of an opto-electronic system according to the present invention.

The person skilled in the art will appreciate that the described embodiments of the opto-electronic system and the method are exemplary in nature only and not to be construed as limiting the scope of protection in any way. The person skilled in the art will realize that alternatives and equivalent embodiments of the opto-electronic system and the method can be conceived and reduced to practice without departing from the scope of protection of the present invention.

Reference will be made to the figures on the accompanying drawing sheets. The figures are schematic in nature and therefore not necessarily drawn to scale. Furthermore, equal reference numerals denote equal or similar parts.

Figure 1:
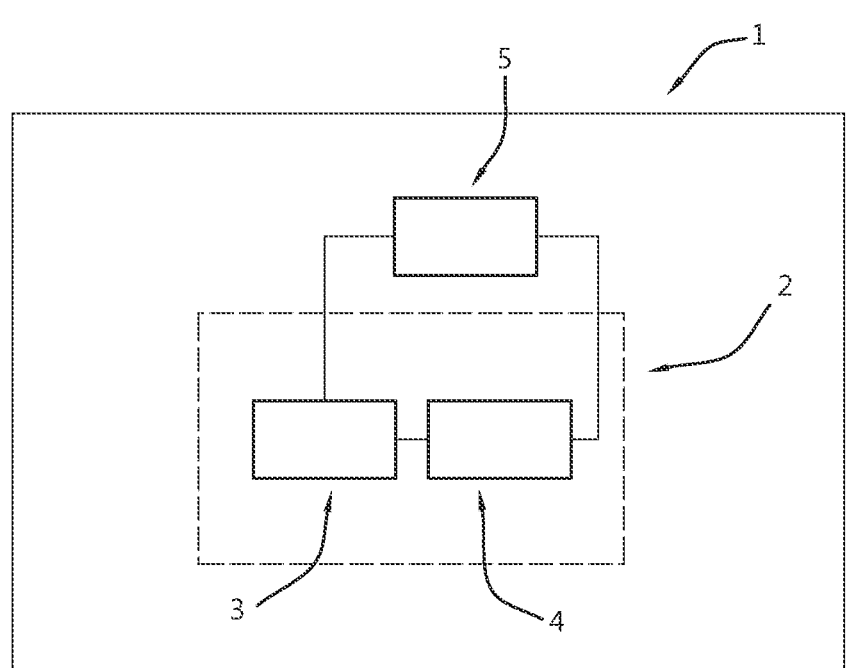
Figure 2:
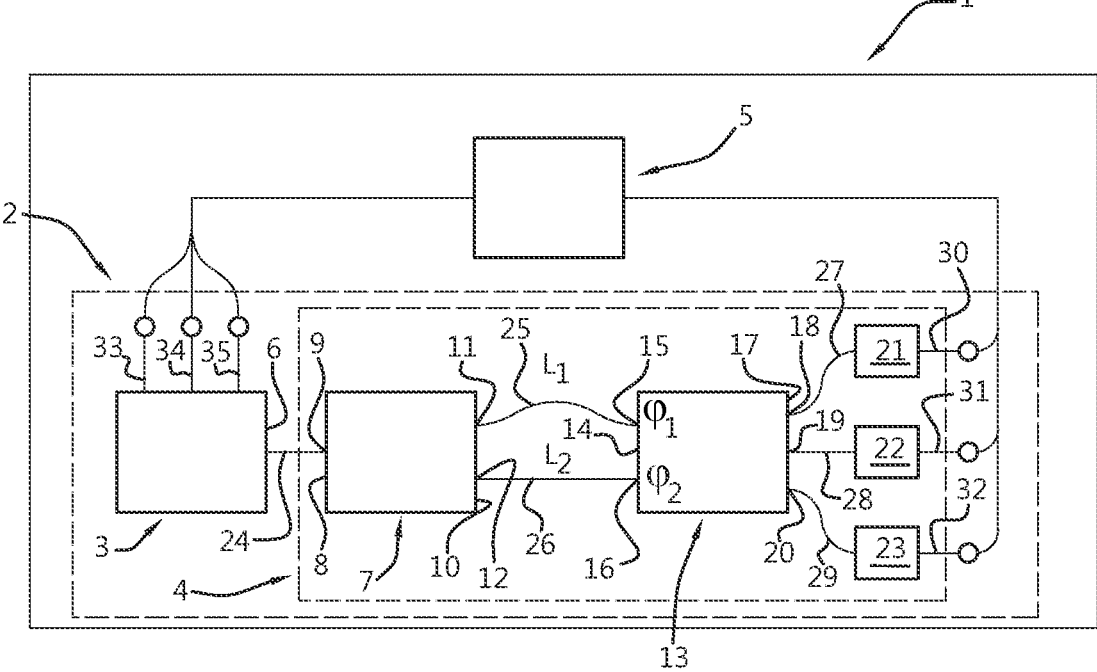
Figure 4:
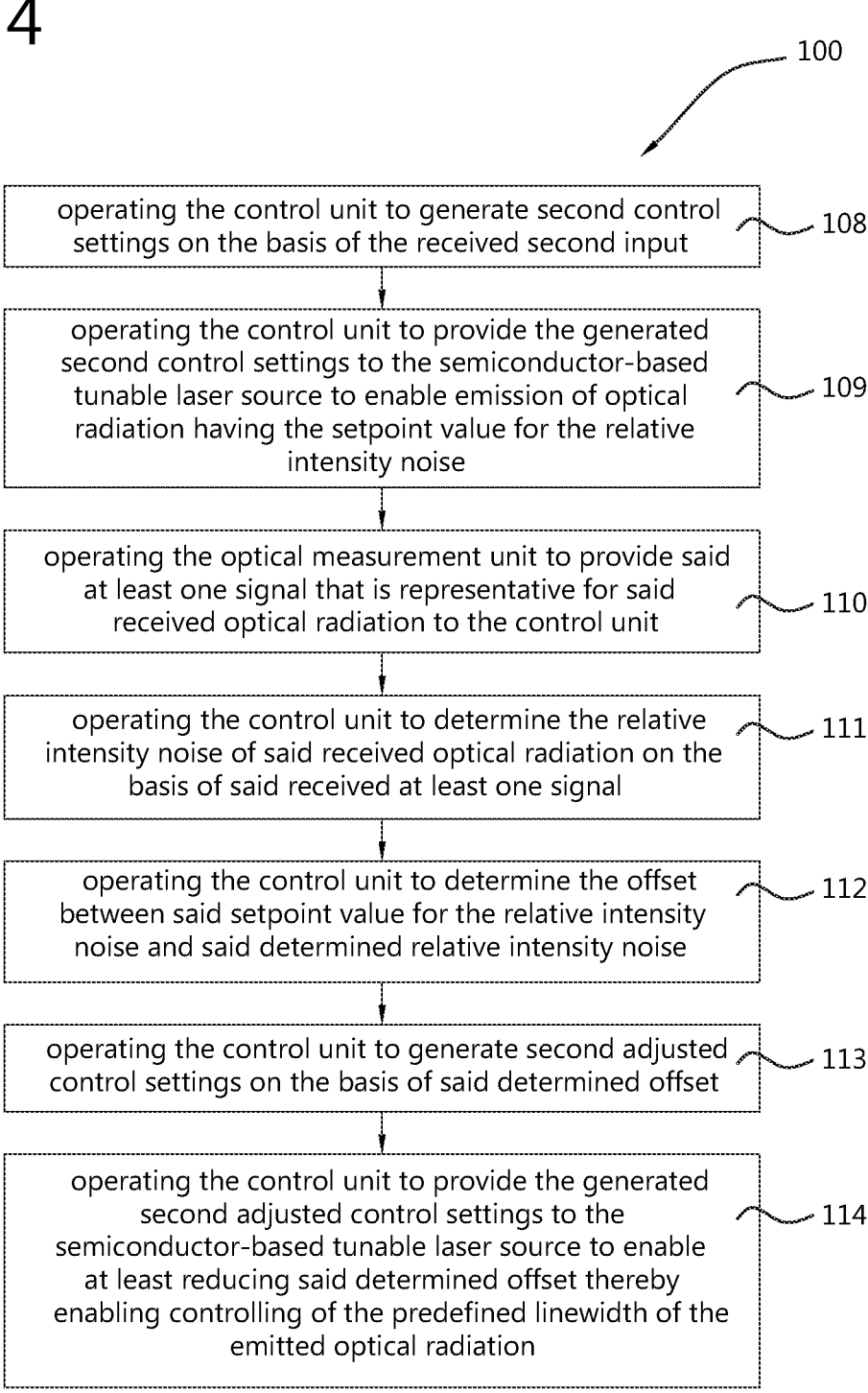

On the attached drawing sheets,

FIG. 1 shows a schematic top view of a first exemplary, non-limiting embodiment of an opto-electronic system according to the present invention that can be used for example, but not exclusively, for optical telecommunication applications, LIDAR or sensor applications;

FIG. 2 shows a schematic top view of a second exemplary, non-limiting embodiment of the opto-electronic system according to the present invention;

FIG. 3 shows a flow diagram of a first exemplary, non-limiting embodiment of a method according to the invention; and FIG. 4 shows a flow diagram of a second exemplary, non-limiting embodiment of the method according to the invention.

DETAILED DESCRIPTION OF EMBODIMENTS

FIG. 1 shows a schematic top view of a first exemplary, non-limiting embodiment of an opto-electronic system 1 according to the present invention that can be used for example, but not exclusively, for optical telecommunication applications, LIDAR or sensor applications. The opto-electronic system 1 comprises a PIC 2 that comprises a semiconductor-based tunable laser source 3 that is configurable to achieve single-mode lasing thereby emitting optical radiation having a predefined linewidth at a predefined operating wavelength. The PIC 2 also comprises an optical measurement unit 4 that is configured and arranged to receive the optical radiation emitted by the semiconductor-based tunable laser source 3 and provide at least one signal that is representative for the received optical radiation. The opto-electronic system 1 further comprises a control unit 5 that is operatively connected with the semiconductor-based tunable laser source 3 and the optical measurement unit 4 of the PIC 2. The control unit 5 can be configured to receive first input including a setpoint value for the predefined operating wavelength of the semiconductor-based tunable laser source 3 at which the optical radiation is to be emitted, generate first control settings on the basis of the received first input, provide the generated first control settings to the semiconductor-based tunable laser source 3 to enable emission of optical radiation at the predefined operating wavelength, receive said at least one signal that is representative for said received optical radiation from the optical measurement unit 4, determine the operating wavelength of said received optical radiation on the basis of said received at least one signal, determine a wavelength shift between said predefined setpoint value for the predefined operating wavelength and said determined operating wavelength, generate first adjusted control settings on the basis of said determined wavelength shift, and provide the generated first adjusted control settings to the semiconductor-based tunable laser source 3 to enable at least reducing said determined wavelength shift thereby enabling locking of the predefined operating wavelength of the semiconductor-based tunable laser source. As discussed above, the opto-electronic system 1 schematically shown in FIG. 1, can provide a faster solution for locking of the predefined operating wavelength of the integrated semiconductor-based tunable laser source 3 than solutions known in the art that use external optical measurement equipment for achieving the above-described wavelength locking of the predefined operating wavelength.

FIG. 2 shows a schematic top view of a second exemplary, non-limiting embodiment of the opto-electronic system 1 according to the present invention. The semiconductor-based tunable laser source 3 of the PIC 2 comprises a back mirror 6 that is configured to have a partial reflectivity that allows emission of a predefined amount of optical power of the optical radiation via the back mirror. In the context of the present invention, the predefined amount of optical power of the optical radiation that is emitted via the back mirror 6 should be sufficient to allow the optical measurement unit 4 to provide at least one signal that is representative for the received optical radiation to the control unit 5 for generating the above-mentioned first adjusted control settings to the semiconductor-based tunable laser source 3. The predefined amount of optical power that is emitted via the back mirror 6 is sufficient if it is in a range of 1 μW (−30 dBm) to 10 mW (10 dBm).

The optical measurement unit 4 in cooperation with the control unit 5 of the second exemplary, non-limiting embodiment of the opto-electronic system 1 shown in FIG.

2, can be used for faster and more accurately locking of the predefined operating wavelength of the semiconductor-based tunable laser source 3. Optical radiation emitted via the back mirror 6 of the semiconductor-based tunable laser source 3 is guided by a first optical waveguide 24 to a first optical interface 9 of a first end part 8 of a first optical splitter-combiner unit 7 of the optical measurement unit 4. The first optical splitter-combiner unit 7 is configured to split the received optical radiation in a first part and a second part. The person skilled in the art will appreciate that the first optical splitter-combiner unit 7 in accordance with the second exemplary embodiment of the opto-electronic system 1 shown in FIG. 2 can be implemented as a 1×2 MMI-based optical splitter-combiner unit. The first part of the received optical radiation is guided by a second optical waveguide 25 from a second optical interface 11 of a second end part 10 of the first optical splitter-combiner unit 7 to a fourth optical interface 15 of a third end part 14 of the second optical splitter-combiner unit 13. The second part of the received optical radiation is guided by a third optical waveguide 26 from a third optical interface 12 of the second end part 10 of the first optical splitter-combiner unit 7 to a fifth optical interface 16 of the third end part 14 of the second optical splitter-combiner unit 13. As the second optical waveguide 25 has a first optical pathlength, L1, that is different from a second optical pathlength, L2, of the third optical waveguide 26, the first part of the received optical radiation has a first phase, f1, at the fourth optical interface 15 of the third end part 14 of the second optical splitter-combiner unit 13 and the second part of the received optical radiation has a second phase, f2, at the fifth optical interface 16 of the third end part 14 of the second optical splitter-combiner unit 13, wherein the first phase, f1, and the second phase, f2, are different from each other.

The second optical splitter-combiner unit 13 shown in FIG. 2 is configured to provide three optical signals having time-varying intensities. The person skilled in the art will appreciate that the second optical splitter-combiner unit 13 can be implemented as a 2×3 MMI-based optical splitter-combiner unit. The afore-mentioned three optical signals are based on the first part and the second part of the received optical radiation. The first optical signal of the three optical signals is guided by a fourth optical waveguide 27 from a sixth optical interface 18 of a fourth end part 17 of the second optical splitter-combiner unit 13 to a first photodetector 21. The second optical signal is guided by a fifth optical waveguide 28 from a seventh optical interface 19 of the fourth end part 17 of the second optical splitter-combiner unit 13 to a second photodetector 22, and the third optical signal is guided by a sixth optical waveguide 29 from an eighth optical interface 20 of the fourth end part 17 of the second optical splitter-combiner unit 13 to a third photodetector 23. At least one of the three photodetectors 21, 22, 23 can comprise an InP-based PD and/or an InP-based SOA. At least one of the optical waveguides 24-29 can be an InP-based optical waveguide, and the semiconductor-based tunable laser source 3 can be an InP-based tunable laser source that is configured to provide optical radiation having a wavelength in a range from 1300 nm to 1600 nm.

Each one of the three photodetectors 21, 22, 23 is configured to provide an electrical signal that is representative for the received respective optical signal of the three optical signals. Each of the three electrical signals is provided to the control unit 5 via the first set of three electrical connection elements 30, 31, 32. The control unit 5 is configured to determine the wavelength shift between the setpoint value for the predefined operating wavelength and the determined operating wavelength on the basis of the time-varying intensities of the received three electrical signals, and to generate first adjusted control settings on the basis of the determined wavelength shift. As mentioned above, the determined wavelength shift is to be construed as a difference between two values.

The generated first adjusted control settings are provided to the semiconductor-based tunable laser source 3 via the second set of electrical connection elements 33, 34, 35, thereby providing controls that allow tuning of the semiconductor-based tunable laser source 3. The generated first adjusted control settings enable at least reducing the determined wavelength shift thereby enabling locking of the predefined operating wavelength of the semiconductor-based tunable laser source 3 at which the optical radiation is emitted. In this way, the control unit 5 can be used to tune the semiconductor-based tunable laser source 3 for maintaining a constant operating wavelength.

The PIC 2 can be a hybrid PIC or a monolithic PIC, thereby providing any one of the above-mentioned advantages. Moreover, the opto-electronic system 1 can be a hybrid, single-die opto-electronic system or an InP-based monolithic opto-electronic system providing any one the above-mentioned advantages.

FIG. 3 shows a flow chart of a first exemplary, non-limiting embodiment of a method 100 according to the invention, which is a method of improved tuning of an integrated semiconductor-based tunable laser source of an opto-electronic system according to the invention. The person skilled in the art will appreciate that the steps 101-107 of the first exemplary, non-limiting embodiment of the method 100 as shown in FIG. 3, can relate to an opto-electronic system 1 that has any one of the features or combinations of features that are disclosed herein. Accordingly, the disclosures of FIGS. 1 and 2 and the above-described aspects of the opto-electronic system 1 are hereby incorporated into the present discussion of the first exemplary, non-limiting embodiment of the method 100.

The steps 101-107 of the method 100 shown in FIG. 3 provide a faster solution for locking of the predefined operating wavelength of the integrated semiconductor-based tunable laser source of the PIC of the opto-electronic system according to the invention than solutions known in the art that use external optical measurement equipment for achieving the above-described wavelength locking of the predefined operating wavelength of an integrated semiconductor-based tunable laser source. At least because of the faster wavelength locking offered by the steps 101-107 in accordance with the first exemplary, non-limiting embodiment of the method shown in FIG. 3, at least one of initialization, calibration and mode mapping of the integrated semiconductor-based tunable laser source of the PIC of the opto-electronic system can be performed faster and consequently at lower costs than the costs that would be incurred by methods known in the art that use external measurement equipment. Moreover, the first exemplary, non-limiting embodiment of the method shown in FIG. 3 enables on-wafer mode mapping of the integrated semiconductor-based tunable laser source of the PIC of the opto-electronic system according to the present invention.

FIG. 4 shows a flow diagram of a second exemplary, non-limiting embodiment of the method 100 according to the invention. The steps 108-114 of the method 100 shown in FIG. 4 enable that the determined relative intensity noise can be used as a feedback signal to achieve controlling of the predefined linewidth of the optical radiation emitted by the semiconductor-based tunable laser source of the opto-electronic system according to the present invention. An advantage of the second exemplary, non-limiting embodiment of the method 100 shown in FIG. 4 is that the components of the optical measurement unit of the opto-electronic system according to the invention do not need to have bandwidths that are higher than the cavity mode spacing of the semiconductor-based tunable laser source of the opto-electronic system to allow using the relative intensity noise as a feedback signal. Another advantage of the second exemplary, non-limiting embodiment of the method 100 shown in FIG. 4 is that direct measurement of the linewidth or direct measurement of the optical spectrum of the optical radiation emitted by the semiconductor-based tunable laser source can be omitted. A further advantage of the second exemplary, non-limiting embodiment of the method 100 shown in FIG. 4 is that it offers fast and accurate control of the linewidth of the optical radiation emitted by the semiconductor-based laser source.

It will be clear to a person skilled in the art that the scope of the present invention is not limited to the examples discussed in the foregoing but that several amendments and modifications thereof are possible without deviating from the scope of the present invention as defined by the attached claims. In particular, combinations of specific features of various aspects of the invention may be made. An aspect of the invention may be further advantageously enhanced by adding a feature that was described in relation to another aspect of the invention. While the present invention has been illustrated and described in detail in the figures and the description, such illustration and description are to be considered illustrative or exemplary only, and not restrictive.

The present invention is not limited to the disclosed embodiments. Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference numerals in the claims should not be construed as limiting the scope of the present invention.

What is claimed is:

1. An opto-electronic system that is configured and arranged to enable improved tuning of an integrated semiconductor-based tunable laser source, the opto-electronic system comprising:

a photonic integrated circuit, PIC, that comprises:

a semiconductor-based tunable laser source that is configurable to achieve single-mode lasing thereby emitting optical radiation having a predefined linewidth at a predefined operating wavelength;

an optical measurement unit that is configured and arranged to:

receive the optical radiation emitted by the semiconductor-based tunable laser source; and provide at least one signal that is representative for the received optical radiation; and a control unit that is operatively connected with the semiconductor-based tunable laser source and the optical measurement unit of the PIC, the control unit being configured to:

receive first input including a setpoint value for the predefined operating wavelength of the semiconductor-based tunable laser source at which the optical radiation is to be emitted;

generate first control settings on the basis of the received first input;

provide the generated first control settings to the semiconductor-based tunable laser source to enable emission of optical radiation at the predefined operating wavelength;

receive said at least one signal that is representative for said received optical radiation;

determine the operating wavelength of said received optical radiation on the basis of said received at least one signal;

determine a wavelength shift between said predefined setpoint value for the predefined operating wavelength and said determined operating wavelength;

generate first adjusted control settings on the basis of said determined wavelength shift; and provide the generated first adjusted control settings to the semiconductor-based tunable laser source to enable at least reducing said determined wavelength shift thereby enabling locking of the predefined operating wavelength of the semiconductor-based tunable laser source; and wherein the control unit is configured to:

receive second input including a setpoint value for relative intensity noise of the optical radiation that is to be emitted by the semiconductor-based tunable laser source;

generate second control settings on the basis of the received second input;

provide the generated second control settings to the semiconductor-based tunable laser source to enable emission of optical radiation having the setpoint value for the relative intensity noise;

receive said at least one signal that is representative for said received optical radiation;

determine the relative intensity noise of said received optical radiation on the basis of said received at least one signal;

determine an offset between said setpoint value for the relative intensity noise and said determined relative intensity noise;

generate second adjusted control settings on the basis of said determined offset; and provide the generated second adjusted control settings to the semiconductor-based tunable laser source to enable at least reducing said determined offset thereby enabling controlling of the predefined linewidth of the emitted optical radiation.

2. The opto-electronic system according to claim 1, wherein the optical measurement unit of the PIC is configured to provide at least three electrical signals, each of the at least three electrical signals having a time-varying intensity and being representative for the optical radiation received from the semiconductor-based tunable laser source, and wherein the control unit is configured to determine the wavelength shift between the setpoint value for the predefined operating wavelength and the determined operating wavelength on the basis of phase information about the at least three electrical signals which is derivable from the time-varying intensities of the at least three electrical signals.

3. The opto-electronic system according to claim 2, wherein the semiconductor-based tunable laser source of the PIC comprises a back mirror that is configured to have a partial reflectivity that allows emission of a predefined amount of optical power of the optical radiation via the back mirror.

4. The opto-electronic system according to claim 1, wherein the semiconductor-based tunable laser source of the PIC comprises a back mirror that is configured to have a partial reflectivity that allows emission of a predefined amount of optical power of the optical radiation via the back mirror.

5. The opto-electronic system according to claim 4, wherein the optical measurement unit of the PIC comprises:

a first optical splitter-combiner unit having:
a first end part that is provided with at least a first optical interface; and
a second end part that is provided with at least a second optical interface and a third optical interface;

a second optical splitter-combiner unit having:
a third end part that is provided with at least a fourth optical interface and a fifth optical interface; and
a fourth end part that is provided with at least a sixth optical interface, a seventh optical interface, and an eighth optical interface;

a set of at least three photodetectors, each of the at least three photodetectors being configured to detect at least a part of the received optical radiation that is emitted via the back mirror of the semiconductor-based tunable laser source;

a plurality of optical waveguides, wherein:
a first optical waveguide of the plurality of optical waveguides is arranged to optically interconnect the first optical interface of the first end part of the first optical splitter-combiner unit and the back mirror of the semiconductor-based tunable laser source;

a second optical waveguide of the plurality of optical waveguides has a first optical pathlength, L1, the second optical waveguide being arranged to optically interconnect the second optical interface of the second end part of the first optical splitter-combiner unit and the fourth optical interface of the third end part of the second optical splitter-combiner unit;

a third optical waveguide of the plurality of optical waveguides has a second optical pathlength, L2, that is different from the first optical pathlength, L1, of the second optical waveguide, the third optical waveguide being arranged to optically interconnect the third optical interface of the second end part of the first optical splitter-combiner unit and the fifth optical interface of the third end part of the second optical splitter-combiner unit;

a fourth optical waveguide of the plurality of optical waveguides is arranged to optically interconnect the sixth optical interface of the fourth end part of the second optical splitter-combiner unit and a first photodetector of said set of photodetectors;

a fifth optical waveguide of the plurality of optical waveguides is arranged to optically interconnect the seventh optical interface of the fourth end part of the second optical splitter-combiner unit and a second photodetector of said set of photodetectors;

a sixth optical waveguide of the plurality of optical waveguides is arranged to optically interconnect the eighth optical interface of the fourth end part of the second optical splitter-combiner unit and a third photodetector of said set of photodetectors;

and wherein the opto-electronic system comprises:
a first set of at least three electrical connection elements, each of the at least three electrical connection elements being arranged to electrically interconnect a respective photodetector of said set of photodetectors of the optical measurement unit of the PIC and the control unit; and a second set of electrical connection elements, each electrical connection element of said second set of electrical connection elements being arranged to electrically interconnect the control unit and the semiconductor-based tunable laser source of the PIC.

6. The opto-electronic system according to claim 5, wherein the first optical splitter-combiner unit and/or the second optical splitter-combiner unit of the optical measurement unit of the PIC is a multimode interference-based, MMI-based, optical splitter-combiner unit.

7. The opto-electronic system according to claim 5, wherein at least one photodetector of the set of at least three photodetectors comprises an InP-based photodiode, PD, and/or an InP-based semiconductor optical amplifier, SOA.

8. The opto-electronic system according to claim 5, wherein at least one optical waveguide of the plurality of optical waveguides is an InP-based optical waveguide.

9. The opto-electronic system according to claim 4, wherein the optical measurement unit of the PIC comprises:

a first optical splitter-combiner unit having:
a first end part that is provided with at least a first optical interface; and
a second end part that is provided with at least a second optical interface and a third optical interface;

a second optical splitter-combiner unit having:
a third end part that is provided with at least a fourth optical interface and a fifth optical interface; and
a fourth end part that is provided with at least a sixth optical interface, a seventh optical interface, and an eighth optical interface;

a set of at least three photodetectors, each of the at least three photodetectors being configured to detect at least a part of the received optical radiation that is emitted via the back mirror of the semiconductor-based tunable laser source;

a plurality of optical waveguides, wherein:
a first optical waveguide of the plurality of optical waveguides is arranged to optically interconnect the first optical interface of the first end part of the first optical splitter-combiner unit and the back mirror of the semiconductor-based tunable laser source;

a second optical waveguide of the plurality of optical waveguides has a first optical pathlength, L1, the second optical waveguide being arranged to optically interconnect the second optical interface of the second end part of the first optical splitter-combiner unit and the fourth optical interface of the third end part of the second optical splitter-combiner unit;

a third optical waveguide of the plurality of optical waveguides has a second optical pathlength, L2, that is different from the first optical pathlength, L1, of the second optical waveguide, the third optical waveguide being arranged to optically interconnect the third optical interface of the second end part of the first optical splitter-combiner unit and the fifth optical interface of the third end part of the second optical splitter-combiner unit;

a fourth optical waveguide of the plurality of optical waveguides is arranged to optically interconnect the sixth optical interface of the fourth end part of the second optical splitter-combiner unit and a first photodetector of said set of photodetectors;

a fifth optical waveguide of the plurality of optical waveguides is arranged to optically interconnect the seventh optical interface of the fourth end part of the second optical splitter-combiner unit and a second photodetector of said set of photodetectors;

a sixth optical waveguide of the plurality of optical waveguides is arranged to optically interconnect the eighth optical interface of the fourth end part of the second optical splitter-combiner unit and a third photodetector of said set of photodetectors;

and wherein the opto-electronic system comprises:

a first set of at least three electrical connection elements, each of the at least three electrical connection elements being arranged to electrically interconnect a respective photodetector of said set of photodetectors of the optical measurement unit of the PIC and the control unit; and a second set of electrical connection elements, each electrical connection element of said second set of electrical connection elements being arranged to electrically interconnect the control unit and the semiconductor-based tunable laser source of the PIC;

and wherein the control unit is configured to:

receive second input including a setpoint value for relative intensity noise of the optical radiation that is to be emitted by the semiconductor-based tunable laser source;

generate second control settings on the basis of the received second input;

provide the generated second control settings to the semiconductor-based tunable laser source to enable emission of optical radiation having the setpoint value for the relative intensity noise;

receive said at least one signal that is representative for said received optical radiation;

determine the relative intensity noise of said received optical radiation on the basis of said received at least one signal;

determine an offset between said setpoint value for the relative intensity noise and said determined relative intensity noise;

generate second adjusted control settings on the basis of said determined offset; and provide the generated second adjusted control settings to the semiconductor-based tunable laser source to enable at least reducing said determined offset thereby enabling controlling of the predefined linewidth of the emitted optical radiation.

10. The opto-electronic system according to claim 9, wherein the optical measurement unit of the PIC is configured to provide at least one electrical signal that comprises a time-varying output current of a photodetector of the at least three photodetectors, and wherein the control unit is configured to:

sample said at least one electrical signal over time for obtaining a set of individual time-sampled components of said at least one electrical signal;

convert said set of individual time-sampled components into a set of individual spectral components that provide frequency information about the at least one electrical signal; and determine the relative intensity noise of the received optical radiation on the basis of said frequency information.

11. The opto-electronic system according to claim 10, wherein the control unit is configured to involve a Fourier Transform for obtaining said set of individual spectral components.

12. The opto-electronic system according to claim 1, wherein the semiconductor-based tunable laser source of the PIC is an InP-based tunable laser source.

13. The opto-electronic system according to claim 1, wherein the PIC is a hybrid PIC or a monolithic PIC.

14. The opto-electronic system according to claim 1, wherein the opto-electronic system is a hybrid, single-die opto-electronic system or an InP-based monolithic opto-electronic system.

15. A method of improved tuning of an integrated semiconductor-based tunable laser source of an opto-electronic system, the opto-electronic system comprising:

a PIC that comprises:

a semiconductor-based tunable laser source that is configurable to achieve single-mode lasing thereby emitting optical radiation having a predefined linewidth at a predefined operating wavelength;

an optical measurement unit that is configured and arranged to:

receive the optical radiation emitted by the semiconductor-based tunable laser source; and provide at least one signal that is representative for the received optical radiation; and a control unit that is operatively connected with the semiconductor-based tunable laser source and the optical measurement unit of the PIC, the control unit being configured to:

receive first input including a setpoint value for the predefined operating wavelength of the semiconductor-based tunable laser source at which the optical radiation is to be emitted;

generate first control settings on the basis of the received first input;

provide the generated first control settings to the semiconductor-based tunable laser source to enable emission of optical radiation at the predefined operating wavelength;

receive said at least one signal that is representative for said received optical radiation;

determine the operating wavelength of said received optical radiation on the basis of said received at least one signal;

determine a wavelength shift between said predefined setpoint value for the predefined operating wavelength and said determined operating wavelength;

generate first adjusted control settings on the basis of said determined wavelength shift; and provide the generated first adjusted control settings to the semiconductor-based tunable laser source to enable at least reducing said determined wavelength shift thereby enabling locking of the predefined operating wavelength of the semiconductor-based tunable laser source;

and wherein the control unit is configured to:

receive second input including a setpoint value for relative intensity noise of the optical radiation that is to be emitted by the semiconductor-based tunable laser source;

generate second control settings on the basis of the received second input;

provide the generated second control settings to the semiconductor-based tunable laser source to enable emission of optical radiation having the setpoint value for the relative intensity noise;

receive said at least one signal that is representative for said received optical radiation;

determine the relative intensity noise of said received optical radiation on the basis of said received at least one signal;

determine an offset between said setpoint value for the relative intensity noise and said determined relative intensity noise;

generate second adjusted control settings on the basis of said determined offset; and provide the generated second adjusted control settings to the semiconductor-based tunable laser source to enable at least reducing said determined offset thereby enabling controlling of the predefined linewidth of the emitted optical radiation;

wherein the method comprises:

operating the control unit to generate first control settings on the basis of the received first input;

operating the control unit to provide the generated first control settings to the semiconductor-based tunable laser source to enable emission of optical radiation at the predefined operating wavelength;

operating the optical measurement unit to provide said at least one signal that is representative for said received optical radiation to the control unit;

operating the control unit to determine the operating wavelength of said received optical radiation on the basis of said received at least one signal;

operating the control unit to determine the wavelength shift between said predefined setpoint value for the predefined operating wavelength and said determined operating wavelength;

operating the control unit to generate first adjusted control settings on the basis of said determined wavelength shift; and operating the control unit to provide the generated first adjusted control settings to the semiconductor-based tunable laser source to enable at least reducing said determined wavelength shift thereby enabling locking of the predefined operating wavelength of the semiconductor-based tunable laser source;

operating the control unit to generate second control settings on the basis of the received second input;

operating the control unit to provide the generated second control settings to the semiconductor-based tunable laser source to enable emission of optical radiation having the setpoint value for the relative intensity noise;

operating the optical measurement unit to provide said at least one signal that is representative for said received optical radiation to the control unit;

operating the control unit to determine the relative intensity noise of said received optical radiation on the basis of said received at least one signal;

operating the control unit to determine the offset between said setpoint value for the relative intensity noise and said determined relative intensity noise;

operating the control unit to generate second adjusted control settings on the basis of said determined offset; and operating the control unit to provide the generated second adjusted control settings to the semiconductor-based tunable laser source to enable at least reducing said determined offset thereby enabling controlling of the predefined linewidth of the emitted optical radiation.

* * * * *